(12) United States Patent
Tygert et al.

(10) Patent No.: US 11,868,698 B1
(45) Date of Patent: Jan. 9, 2024

(54) CONTEXT-AWARE CIRCUIT DESIGN LAYOUT CONSTRUCT

(71) Applicant: Cadence Design Systems, Inc., San Jose, CA (US)

(72) Inventors: Joshua David Tygert, Seneca, PA (US); Jonathan R. Fales, Finksburg, MD (US); Rwik Sengupta, Austin, TX (US); Timothy H. Pylant, La Grange, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 65 days.

(21) Appl. No.: 17/541,171

(22) Filed: Dec. 2, 2021

(51) Int. Cl.
*G06F 30/392* (2020.01)
*G06F 30/31* (2020.01)
*G06F 30/398* (2020.01)

(52) U.S. Cl.
CPC ............ *G06F 30/392* (2020.01); *G06F 30/31* (2020.01); *G06F 30/398* (2020.01)

(58) Field of Classification Search
CPC .................................................... G06F 30/392
USPC ........................................................ 716/119
See application file for complete search history.

(56) References Cited

U.S. PATENT DOCUMENTS 8,490,036 B2  7/2013  Waller
10,460,069 B1 * 10/2019  Burdick .................. G06F 30/39

* cited by examiner

*Primary Examiner* — Eric D Lee
(74) *Attorney, Agent, or Firm* — Schwegman Lundberg & Woessner, P.A.

(57) ABSTRACT

Various embodiments provide for context-aware circuit design layout construct, which may be part of electronic design automation (EDA). In particular, some embodiments enable use of a circuit design layout construct with a layout of a circuit design (hereafter, a circuit design layout), where a programmable pattern of layout shapes of the circuit design layout construct can be inserted into a circuit design layout and can be adapted based on context information associated with the location of its placement within the circuit design layout.

20 Claims, 10 Drawing Sheets

610  620

STYLE 1   STYLE 2

CONTEXT-AWARE CIRCUIT DESIGN LAYOUT CONSTRUCT

TECHNICAL FIELD

Embodiments described herein relate to circuit design and, more particularly, to systems, methods, devices, and instructions for a context-aware circuit design layout construct, which may be part of electronic design automation (EDA).

BACKGROUND

Designing a circuit layout is an interactive process often facilitated through a graphical circuit design system, such as an electronic design automation (EDA) software system. Generally, a circuit layout comprises one or more points on a graph, where multiple points can form high-level objects, such as lines, corners, or shapes. A high-level object can be represented as a combination of one or more points and other high-level objects. When higher-level objects are independent of each other, such as on a different design layer or on the same design layer (but not impinging on each other), a relationship can be defined between these independent objects. Additionally, a relationship can be defined within a single, high-level object (e.g., shape) for its low-level objects (e.g., points).

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
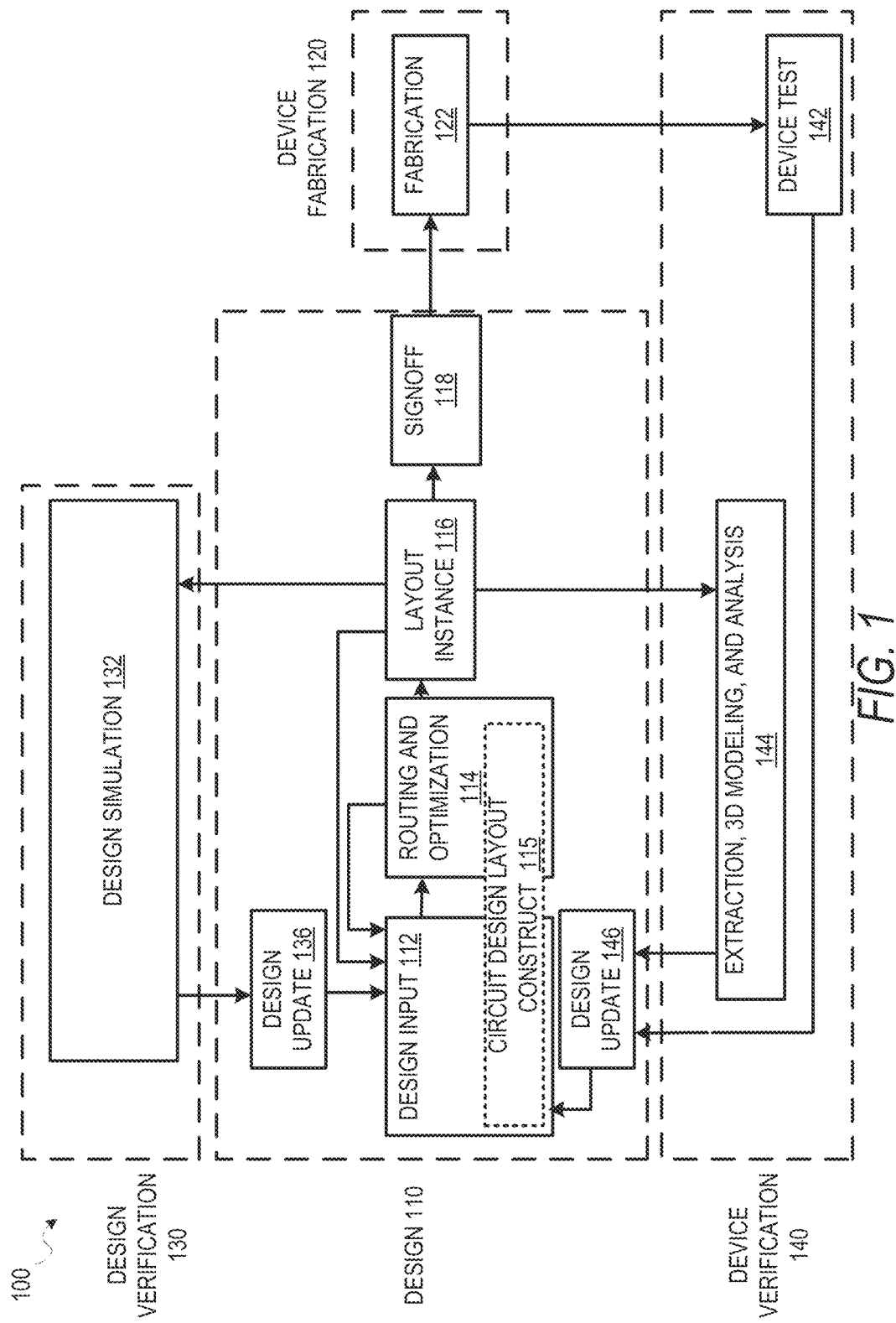
FIG. 1 is a diagram illustrating an example design process flow that uses one or more circuit design layout constructs, according to some embodiments.

Various embodiments provide for context-aware circuit design layout construct (hereafter, layout construct), which may be part of EDA. More specifically, some embodiments enable use of a layout construct with a layout of a circuit design (hereafter, a circuit design layout), where a programmable pattern of layout shapes of the layout construct can be inserted into a circuit design layout (e.g., onto different layers of the circuit design layout) and can be adapted (e.g., selectively modified) based on context information associated with the location of its placement within the circuit design layout.

Generally, custom circuit layout design involves the manual task of drawing each layout shape or creating a fixed or parameterizable collection of shapes and then adding those shapes to the layout. While conventional technologies can automatically insert a via into a circuit layout, such an automatic process is not context aware and can involve an iterative use of a design rule constraints (DRC) engine to facilitate a DRC clean insertion of a via. Additionally, existing techniques of pattern matching and pattern replacement for inserting patterns of layout shapes into circuit layout usually comprise a simple search and replace of a fixed pattern.

Various embodiments described herein enable use of a layout construct that is adapted (e.g., selectively adjusted or modified) based on context information associated with the location of its placement within a circuit design. In particular, according to various embodiments, a layout construct comprises an abstracted structure that is a programmatic representation of a pattern of layout shapes, which can represent one or more circuit elements in a circuit design layout (e.g., on different layers), such as a via connecting two nets on two different metal layers. The layout shapes of the programmable pattern can comprise different sets of layout shapes inserted on to different layers of a circuit design layout. Within a layout construct, each layout shape can be defined by a plurality of vertices, one or more of which can be adjusted based on one or more adjustments to the programmable pattern of the layout construct. Additionally, the layout shapes within the pattern can be adapted based on ground rules (e.g., DRCs, topology, etc.) of a circuit design layout in which it is placed and based on the electrical and physical context information regarding the location of its placement within the circuit design layout. In this way, the pattern of layout shape vertices of a layout construct is a programmable pattern of layout shape vertices, which can be programmatically adapted based on the context of where the programmable pattern of layout shape vertices is placed in a circuit design layout. Adapting a layout construct based on context information of its placements enables various embodiments to account for DRCs during the adaption, where such DRCs (in conjunction with the ground rules) govern the relative positions and dimensions of each layout shape present in the programmable pattern of the layout construct. Depending on the embodiments, adapting (e.g., adjusting or modified) a programmable pattern of layout shapes can comprise an adjustment of a dimension (e.g., height or width) of a layout shape of the programmable pattern, an adjustment of a relative position of a layout shape within the programmable pattern, or an adjustment of a topology of a layout shape of the programmable pattern (e.g., layer assignment of the layout shape). Additionally, the adaption can be facilitated (e.g., programmatically) by setting or adjusting a value of a variable associated with a layout shape within a programmable pattern. For instance, a programmable pattern can comprise a layout shape that implements one or more static grounds rules (e.g., static dimension or static relative position within the programmable pattern) and that implements one or more variable ground rules, which can have a value determined based on context information regarding its placement location within a circuit design layout. By the one or more variable ground rules, the programmable pattern of layout shapes can be adapted based on context of the programmable pattern's placement within a circuit design layout.

According to some embodiments, a layout construct is represented by an object (e.g., layout construct object, which can be implemented as software data structure) that can be placed (e.g., inserted or added) to a location on a circuit design layout, which facilitates placement (e.g., insertion or addition) of the pattern of layout shapes of the layout construct at the location and adaptation of the pattern of layout shapes for the location. Additionally, for some embodiments, the pattern of layout shapes are is adapted such that its placement at a location in a circuit design layout results in a layout implementation that avoid design rule constraints (DRC) and layout versus schematic (LVS) violations (e.g., DRC and LVS clean implementation).

By using context information (e.g., physical and electrical context) in adapting a programmable pattern of a layout construct for a location on a circuit design layout, various embodiments can take into account ground rules and design rule constraints (which govern the relative positions and dimensions of each layout shape in the programmable pattern) during the adaption, which can help avoid ground rule and design rule constraint violations and can help avoid the user of a traditional iterative circuit design process (e.g., inserting layout shapes into a circuit layout, and iteratively running a DRC engine and adjusting layout shapes based on violations). For instance, based on ground rules and design rule constraints, various embodiments can determine legal areas of placement for a layout construct by generating a footprint or halo area around shapes that are to be connected to make sure that there are no other shapes in the area.

Within a layout construct, a footprint (or halo) can be defined per layer, where each layer in the construct has a region of interest defined by a DRC rule subset (e.g., a DRC rule subset that was used to generate the layout construct). This footprint/halo can assist in identifying layout construct placement locations, and in identifying layout constructs for those locations. For example, one or more footprints associated with a single layout shape can be saved and used to prevent placement of a future layout shape that would result in overlap with one or more footprints of the single layout shape or result in a footprint of the future layout shape overlapping with the one or more footprints of the single layout shape. In this way, various embodiments can avoid creation of a short within a circuit design. An example of a footprint for a single layout shape can extend 0.01 in all directions from the single layout shape based on an edge rule 0.01, where no new layout shape on the same layer as the single layout shape can be placed inside the footprint but the footprint of the new layout shape can overlap with the footprint of the single layout shape.

A layout construct provides a technical solution for abstracting a pattern of layout shapes, which can enable the pattern of layout shapes to be created and adapted (e.g., on the fly), on different layers of a circuit design layout, based on the context of where the pattern of layout shapes is placed in the circuit design layout and based on one or more ground rule constraints of the circuit design layout (e.g., technology ground rules associated with a node or a standard architecture). In doing so, various embodiments can use a layout construct described herein to implement ground rule-clean layout shapes representing physical features on a circuit layout. Additionally, a layout construct can enable development and deployment of a topological construct that can be reused across multiple technology nodes or standard cell architectures.

As used herein, a circuit design layout construct (or layout construct) can be implemented as a software data object or data structure, which can be a pattern of layout shapes or vertices of those layout shapes and enable programmatic adjustment of the pattern of layout shapes. This pattern can be referred to herein as a programmable pattern of layout shapes, and an adjustment to the programmable pattern can be facilitated through one or more variables of the layout construct (e.g., setting or defining a variable value). A programmable pattern of layout shapes of a layout construct can be implemented such that one or more ground rules for a circuit design layout are respected or adhered to, where one or more variables of the layout construct are associated with implementing a ground rule based on a value that is determined based on the context of where the layout construct is placed in a circuit design layout.

As used herein, a ground rule can comprise a rule that implements one or more design rule constraints or topology definitions or constraints, and a ground rule can vary based on circuit technology or architecture selection (e.g., node or standard cell architecture selected for implementing as circuit layout design as a physical circuit). An example ground rules can include, without limitation, an edge-to-edge rule applied to distances between layout shapes represent certain elements of a circuit design.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 that uses one or more circuit design layout constructs, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floor planning, placement, post-placement optimization, and post-routing optimization. As shown, a circuit design layout construct 115 operation (hereafter, layout construct 115 operation) can be performed as part of the design input 112 operation or the routing and optimization 114 operation, where the layout construct 115 operation facilitates use of a layout construct with respect to a circuit design layout, in accordance with various embodiments described herein. For some embodiments, the layout construct 115 operation comprises placement (e.g., insertion) and adaption of a layout construct with respect to a location on a circuit design layout. Some or all of the layout construct 115 operation can be performed as part of a batch process performed on a circuit design layout, or can be performed as a user interacts with a circuit design tool (e.g., an EDA software system) to design a circuit design layout.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation through a process, such as logic-synthesis to generate a circuit netlist mapped to a target standard library manufacturable by the foundry in fabrication 122. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

According to some embodiments, the layout construct 115 operation supports (e.g., placement and adaption) a layout construct that represents a pattern (e.g., collection) of layout shapes that are on single or multiple layers (e.g., related mask levels) of a circuit design layout, where the pattern is programmatically adaptable (e.g., adjustable or modifiable) based on a location of its placement and the context of the location. The pattern (or programmable pattern) of a layout construct can be managed or interpreted by an embodiment (e.g., the layout construct 115 operation) as a singular object placed on a circuit design layout. Adaption of a layout construct can comprise adjusting one or more layout shapes of the layout construct based on one or more design rule constraints that govern the relative positions and dimensions of each layout shape in the layout construct. For some embodiments, the adaption of the layout construct is performed without changing a topology of one or more layout shapes of the layout construct. Alternatively, or additionally, the adaption of the layout construct is performed by adjusting (e.g., changing or transforming) a topology of one or more layout shapes of the layout construct (e.g., as needed) based on the location of one or more other layout shapes (e.g., of the circuit design layout or of another layout construct inserted in the circuit design layout) that the layout construct connects to and based on the context of the layout construct's placement location. Such topology adjustments can be constrained by one or more intrinsic relationships of ground rules of the circuit design layout that are applicable to the programmable pattern of layout shapes of the layout construct.

During the layout construct 115 operation, a location in a circuit design layout is identified for layout construct placement (e.g., insertion) in the circuit design layout. After a location is identified for layout construct placement in a circuit design layout, a single layout construct suitable for the location can be identified from a set (e.g., library) of layout constructs by detecting the context of the location and the relation between one or more existing layout shapes of the circuit design layout that layout shapes of the single layout construct will connect to. The single layout construct is placed (e.g., inserted) in the circuit design layout while respecting ground rules of the circuit design layout with respect to one or more other layout shapes of the circuit design layout or another layout construct placed (e.g., inserted) in the circuit design layout. According to some embodiments, a layout construct is placed on a circuit design layout to connect two or more layout shapes, where the two or more layout shapes can represent a same net of a circuit design. Additionally, connectivity information of a placed layout construct (in a circuit design layout) can be maintained such that one or more nets of the circuit design layout can be routed using standard routing (e.g., during the routing and optimization 114 operation).

After signoff verification by the signoff 118, a verified version of the layout is used in the fabrication 122 operation to generate a device, or additional testing and design updates may be performed using designer inputs or automated updates based on design simulation 132 operations or extraction, three-dimensional (3D) modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

Figure 2:
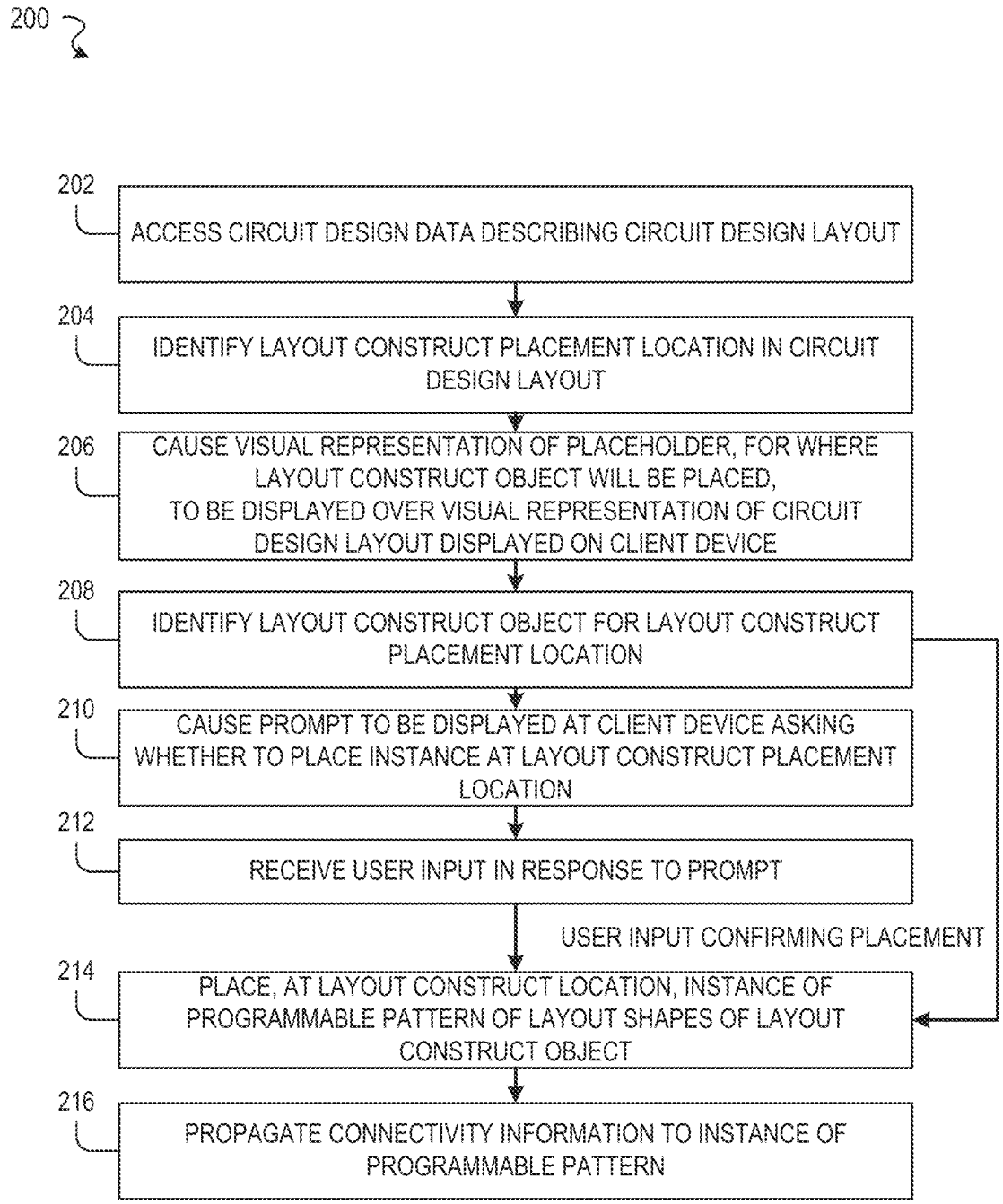
FIG. 2 is a flowchart illustrating an example method for a circuit design layout construct, according to some embodiments.

FIG. 2 is a flowchart illustrating an example method 200 for a circuit design layout construct, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For example, the operations of the method 200 can be represented by executable instructions that, when executed by a hardware processor of a computing device, cause the computing device to perform the method 200. Further, for some embodiments, the method 200 is performed (or otherwise implemented) by a search and apply engine 360 of FIG. 3. An operation of a method described herein can be performed by a hardware processor (e.g., central processing unit or graphics processing unit) of a computing device (e.g., desktop, server, etc.). Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

At operation 202, circuit design data that describes a circuit design layout is accessed. The circuit design layout can comprise one or more existing layout shapes, where layout shapes can be on different layers (or levels) of the circuit design layout and where the layout shapes form different elements of a circuit design.

During operation 204, a layout construct placement location in the circuit design layout is identified (e.g., detected) based on a detected pattern of layout shapes at the layout construct placement location. For some embodiments, the layout construct placement location comprises a location on the circuit design layout where the detect pattern of layout shapes of the circuit design layout is suitable for insertion of a programmable pattern of layout shapes of at least one layout construct object, where the programmable pattern embeds one or more ground rules of the circuit design layout. An embodiment can identify the layout construct placement location by identifying a context and a relative position of existing layout shapes of a circuit design layout. For example, the context and the relative position of existing layout shapes can be for a device terminal, such as a source, drain, or gate pin (e.g., metal pin) of a MOSFET device or transistor, and a metal layer (e.g., M1) to be connected. within a net of a circuit design layout. In another example, the context and the relative position of existing layout shapes can be for two or more nets (of the same net or different nets) that are to be connected and that are on different layers of the circuit design layout. For some embodiments, operation 204 is performed at least in part by a pattern analysis component (e.g., engine), which may be capable of identifying (e.g., detecting) a specified pattern of layout shapes within a circuit design layout.

Prior to identifying a layout construct object for the layout construct placement location, at operation 206, a visual representation of a placeholder, for where the layout construct object will be placed, is caused to be displayed at a location over a visual representation of the circuit design layout, where the visual representation of the circuit design layout is displayed on a client device (e.g., that is using an EDA software system), and where the location corresponds to the layout construct placement location (identified by operation 204). For instance, a visual representation of the circuit design layout can be displayed by way of a graphical user interface of an EDA software system, and a layout shape representing a placeholder for the layout construct object can be displayed over the visual representation of the circuit design layout, thereby providing a user with a preview of where the programmable pattern of layout shapes will eventually be placed. Additionally, after an instance of the programmable pattern is placed at the layout construct placement location, a footprint or a halo can be displayed in connection with (e.g., relative to) visual representations of layout shapes of the programmable pattern, where the footprint/halo provides a user with an idea of one or more ground rule constraints associated with the layout construct object.

At operation 208, a layout construct object is identified (e.g., selected), from a set of layout construct objects (e.g., set that is available for the circuit design layout), for the layout construct placement location (identified by operation 204) based on context information associated with the layout construct placement location and a programmable pattern of layout shapes defined by the layout construct object. In particular, operation 208 can comprise identifying the layout construct object for the layout construct placement location based on relation of one or more layout shapes at or around the layout construct placement location that the programmable pattern of layout shapes is configured to intending to connect to. In this way, operation 208 can identify a suitable layout construct object in view of the detected insertion context associated with the layout construct placement location and in view of the relation between existing layout shapes of the circuit design layout that the layout shapes of the programmable pattern would connect to. For instance, where the layout construct placement location is a location where a connection between two or more layers (e.g., connection between NET A on one metal layer and NET A on another metal layer) is to be generated, the layout construct object identified can comprise a programmable pattern of layout shapes that implements a via connecting the two or more layers (while respecting or adhering to one or more ground rules of the circuit design layout). Additionally, the programmable pattern of layout shapes can identify connections to be made between existing layout shapes of the circuit design layout and the layout shapes of the programmable pattern after the programmable pattern of layout shapes is placed (e.g., inserted into) the circuit design layout. In doing so, operation 208 can identify a correction version of a layout construct object that is suitable for placement at the layout construct placement location.

The context information can be associated with one or more existing layout shapes of the circuit design layout, where such existing layout shapes can be associated with the layout construct placement location (e.g., existing layout shapes at or in close proximity to the layout construct placement location). For instance, the context information can be associated with one or more existing layout shapes of the circuit design layout to which one or more layout shapes of the programmable pattern are to connect. The context information can comprise electrical or physical context information regarding the one or more existing layout shapes. The electrical context information can comprise, for example, information regarding a net type, a net name, or a net classification, such as voltage level or a relationship between different nets associated with an existing layout shape of the circuit design layout. The electrical context information can comprise, for example, a position, a topology, or a dimension of an existing layout shape of the circuit design layout.

According to various embodiments, the layout construct object defines the programmable pattern of layout shapes by a plurality of vertices for layout shapes of the programmable pattern, where one or more of the vertices can be adjusted based on context information. For some embodiments, the programmable pattern of layout shapes comprises an adjustable layout shape that has at least one of an adjustable dimension or an adjustable position (e.g., topology adjustment) within the programmable pattern. The programmable pattern of layout shapes comprises a plurality of such adjustable layout shapes. Additionally, for some embodiments, the programmable pattern of the layout construct object embeds information regarding one or more ground rules for a circuit design layout, where the programmatic pattern can implement one or more static grounds rules (e.g., static dimension or static relative position within the programmable pattern) with respect to the layout shapes of the programmable pattern, and can implement one or more variable ground rules with respect to the layout shapes. A variable ground rule can apply a rule based on a value and the value for that variable ground rule can be determined (e.g., during operation 214) based on context information regarding its placement location within a circuit design layout. Prior to its use, a layout construct object can be generated based on at least one of a set of design rules constraints, a circuit design topology, a circuit architecture selection, or a design rule variation.

Depending on the embodiment, after operation 208, the method 200 can proceed to operation 210 or proceed to operation 214.

At operation 210, a prompt is caused to be displayed at a client device (e.g., that is using an EDA software system), where the prompt asks a user at the client device whether desire to place the instance at the layout construct placement location. At operation 212, a user input is received in response to the prompt, where the instance is placed at the layout construct placement location based on the user input. For example, the method 200 can proceed to operation 214 and placement of the instance of the programmable patter of layout shapes at the layout construct placement location in response to the user input indicating that the user confirms his or her desire to proceed with the placement. Operations 204, 206, 208, 210 and 212 can be performed as a user interacts with a circuit design tool, such as an EDA software system. For instance, as a user interacts with the circuit design tool, a layout construct placement location can be detected, a suitable layout construct object can be identified for the location, and a user can be prompted as to whether he or she desired to add the layout construct object to the location. In this way, operations 204, 206, 208, 210 and 212 can be used as an exploratory feature (e.g., solicit user input at critical steps) or a suggestion feature (e.g., auto suggestions), where a user can select whether to add layout construct objects at identified layout construct placement locations on a circuit design layout. In place of a prompt, a user can safe a preference to have layout construct objects automatically added to a circuit design layout.

At operation 214, an instance of the programmable pattern of layout shapes, from the layout construct object (identified by operation 208), is placed (e.g., applied or inserted) at the layout construct placement location (identified by operation 204). For various embodiments, the layout construct object specifically identified by operation 208 for the layout construct placement location is identified for one or more other layout construct placement locations of the circuit design layout, and a separate instance of the programmable pattern of the layout construct object can be placed (e.g., inserted and adapted) at each of those other layout construct placement locations. For some embodiment, operation 214 comprises adjusting (e.g., selectively modifying or adapting), based on the context information (e.g., insertion context), the adjustable layout shape in the instance of the programmable pattern of layout shapes. The adjustment to the adjustable layout shape can comprise adjusting a dimension (e.g., width or height) or of the adjustable layout shape or a relative position (e.g., topology or two-dimensional position) of the adjustable layout shape within the programmable pattern. For instance, based on the context information, a topology of the programmable pattern of layout shapes can be adjusted (e.g., transformed). In this way, the topology of the programmable pattern of layout shapes can be selectively adjusted as needed by the location of one or more other layout shapes of the circuit design layout that the programmable pattern connects to.

With respect to an adjustable layout shape of the programmable pattern, the adjustable dimension, the adjustable position, or both can be determined by a value of a variable of the layout construct object, which can be programmatically adjusted. Accordingly, an adjustment of an adjustable layout shape based on context information can comprise setting the value based on the context information.

According to various embodiments, one or more adjustable layout shapes of the programmable pattern are adjusted by operation 214, and the layout construct object is configured such that adjustments to the programmable pattern respects or adheres to one or more ground rules of the circuit design layout. In this way, adjustment of the one or more adjustable layout shapes of the programmable pattern can ensure that placement of the programmable pattern on the circuit design layout results in a DRC and INS clean circuit design.

At operation 216, connectivity information of the circuit design layout is propagated with respect to the instance of the programmable pattern of layout shapes placed by operation 214. For instance, one or more net names or labels (e.g., NET A or NET B) associated with one or more existing layout shapes of the circuit design layout are propagated through the layout construct object. By operation 216, the instance of the programmable pattern of layout shapes can inherit connectivity properties of the circuit design layout based on connections formed between the programmable pattern and one or more existing layout shapes of the circuit design layout. The propagation of connectivity information ensures that a circuit design tool (e.g., EDA software system) knows that the instance of the programmable pattern of layout shapes (as adapted by operation 214) is part of one or more existing nets of the circuit design layout, which can enable the programmable pattern of layout shapes and the nets to which it is connected to be routed by the circuit design tool.

Figure 3:
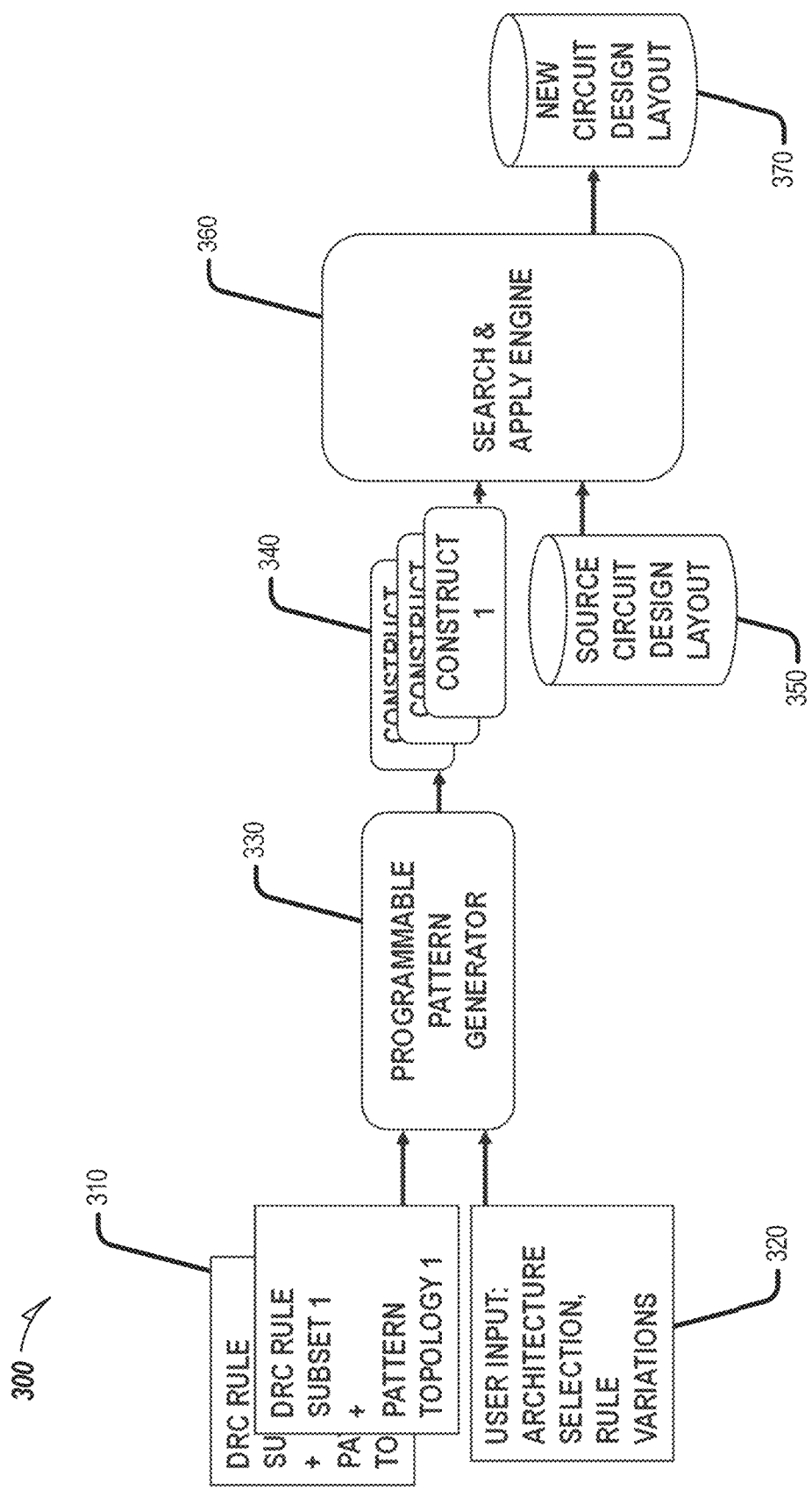
FIG. 3 is a flowchart illustrating an example dataflow for using one or more circuit design layout constructs, according to some embodiments.

FIG. 3 is a flowchart illustrating an example dataflow 300 for using one or more circuit design layout constructs, according to some embodiments. The example dataflow 300 may be implemented in the form of executable instructions stored on a computer-readable medium or in the form of electronic circuitry. As shown, a programmable pattern generator 330 is configured to receive, as input: one or more input sets 310 that each comprise a DRC rule subset and a pattern topology interest; and one or more user inputs 320, which can include a circuit architecture selection and a rule variation. Based on the received input, the programmable pattern generator 330 can generate one or more layout construct objects 340, which embed one or more ground rules that are determined based on the received input (e.g., one or more DRCs, pattern topology definitions or constraints, and different circuit architectures). A search and apply engine 360 is configured to receive a source circuit design layout 350, search the source circuit design layout 350 for one or more layout construct placement locations within the source circuit design layout 350, identify a suitable layout construct object for each of the one or more layout construct placement locations, and apply (e.g., place or insert) the identified suitable layout construct objects to the one or more layout construct placement locations. Application of the identified suitable layout construct objects to the one or more layout construct placement locations of the source circuit design layout 350 results in a new circuit design layout 370.

Figure 4:
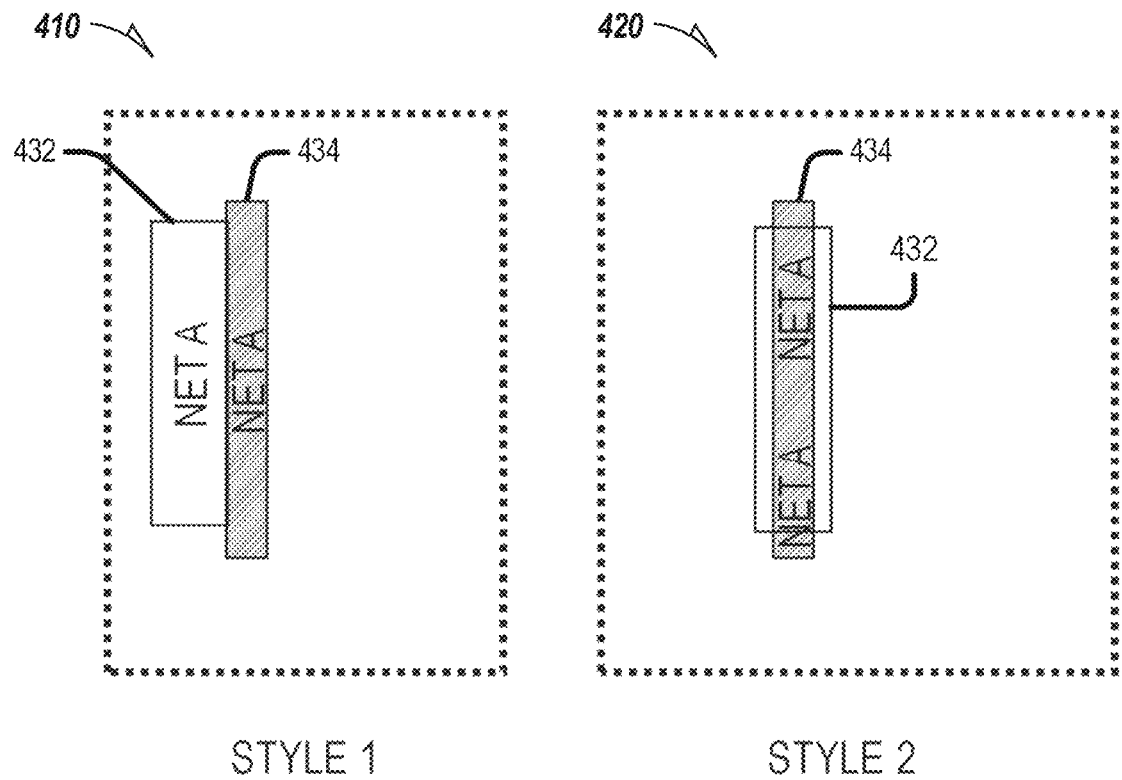
FIGS. 4 through 8 are diagrams illustrating example operations for using a circuit design layout construct, according to some embodiments.

FIGS. 4 through 8 are diagrams illustrating example operations for using a circuit design layout construct, according to some embodiments. FIG. 4 illustrates example locations 410, 420 of a circuit design layout, which can be identified by some example embodiments as layout construct placement locations. In particular, each of the locations 410, 420 is a location where a connection is to be made between two layout shapes 432, 434, on two different layers of a circuit design layout, that are associated with a net NET A. The location 410 represents a first style (STYLE 1) of connection to be made, where the layout shapes 432, 434 do not overlap with each other. The location 420 represents a second style (STYLE 2) of connection to be made, where the layout shapes 432, 434 overlaps with each other.

Figure 5:
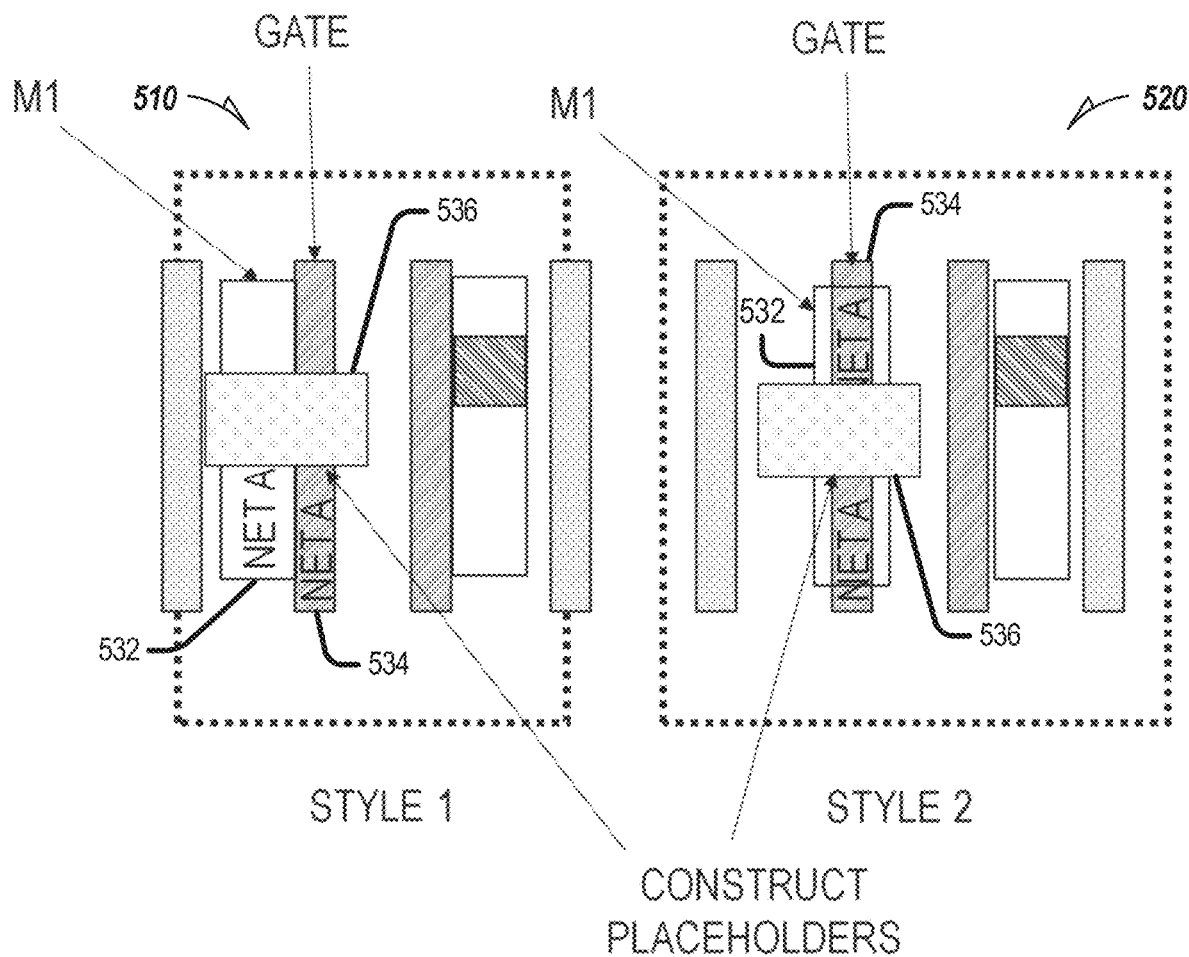

FIG. 5 illustrates example locations 510, 520, which can be identified by some example embodiments as layout construct placement locations. Similar to FIG. 4, each of the locations 510, 520 is a location where a connection is to be made between layout shapes 532, 534, on two different layers of a circuit design layout, that are associated with a net NET A. The location 510 represents the first style (STYLE 1) of connection to be made, where the layout shapes 532, 534 do not overlap with each other. The location 520 represents the second style (STYLE 2) of connection to be made, where the layout shapes 532, 534 overlaps with each other. In FIG. 5, the layout shape 532 represents an element on metal layer one (M1) and the layout shape 534 represents a gate (e.g., of a MOSFET device or transistor).

A layout construct object that can facilitate connection of the layout shapes 532, 534 can be identified for each of the locations 510, 520. The same layout construct object or different layout construct objects can be identified the locations 510, 520. According to some embodiments, prior to identification of the layout construct object, a visual representation of a placeholder 536 for where a layout construct object will be placed (once identified).

Figure 6:
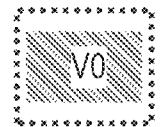
Figure 6:

FIG. 6 illustrates example layout construct objects 610, 620 that can be identified for different styles of connections to be made. In particular, the layout construct object 610 is identified (e.g., selected) for a first style (STYLE 1) of connection to be made, and the layout construct object 620 is identified (e.g., selected) for a second style (STYLE 1) of connection to be made. Each of the layout construct objects 610, 620 can comprise a programmable pattern that implements a via for connecting elements of a net NET A.

Figure 7:
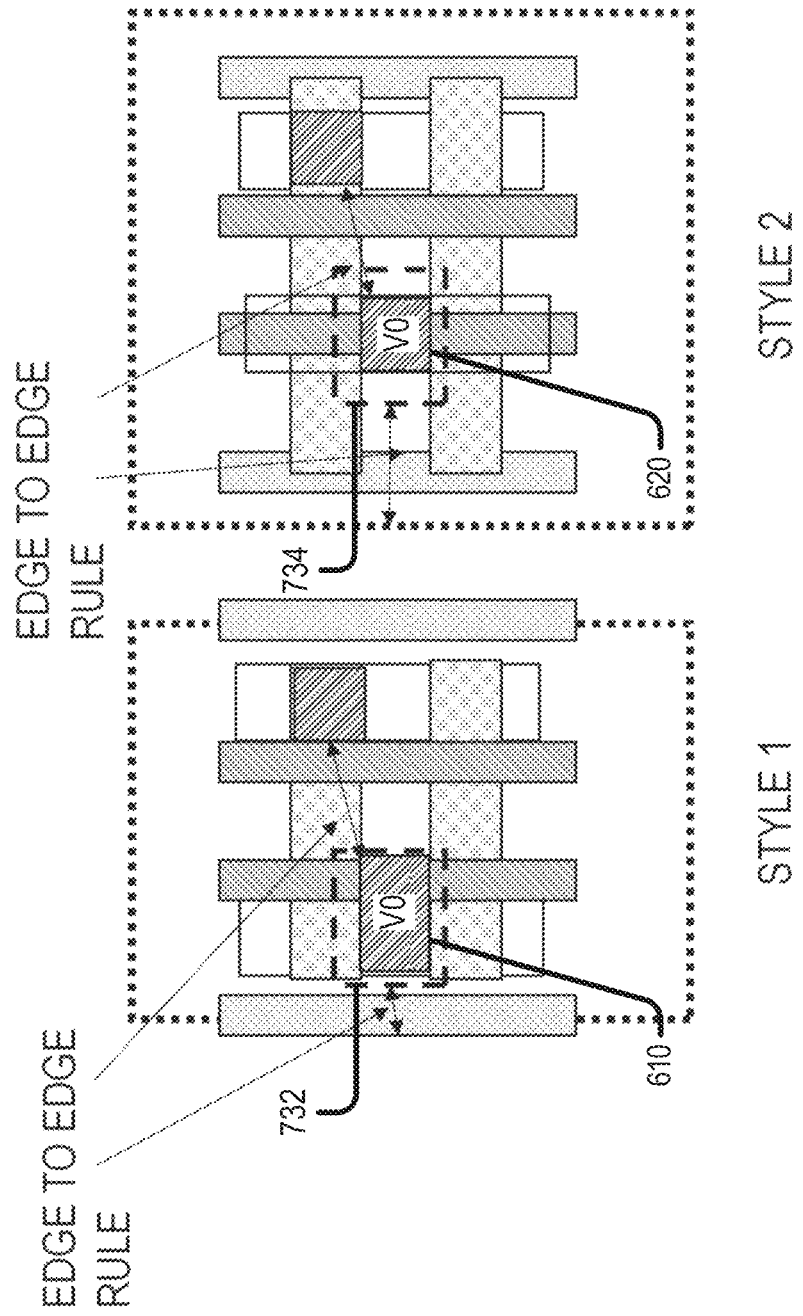

FIG. 7 illustrates identification and placement of the layout construct object 610 at the layout construct placement location identified for the location 510, and identification and placement of the layout construct object 620 at the layout construct placement location identified for the location 520. As shown, a visual representation 732 of a footprint or halo of the layout construct object 610 is displayed, which can visually represent one or more ground rule constraints that will be used to adapt the layout construct object 610. Additionally, a visual representation 734 of a footprint of the layout construct object 620 is displayed, which can visually represent one or more ground rule constraints that will be used to adapt the layout construct object 620. In FIG. 7, each of the visual representations 732, 734 can be represent a ground rule relating to an edge-to-edge rule with respect to other elements (e.g., vias) of the circuit design layouts.

Figure 8:
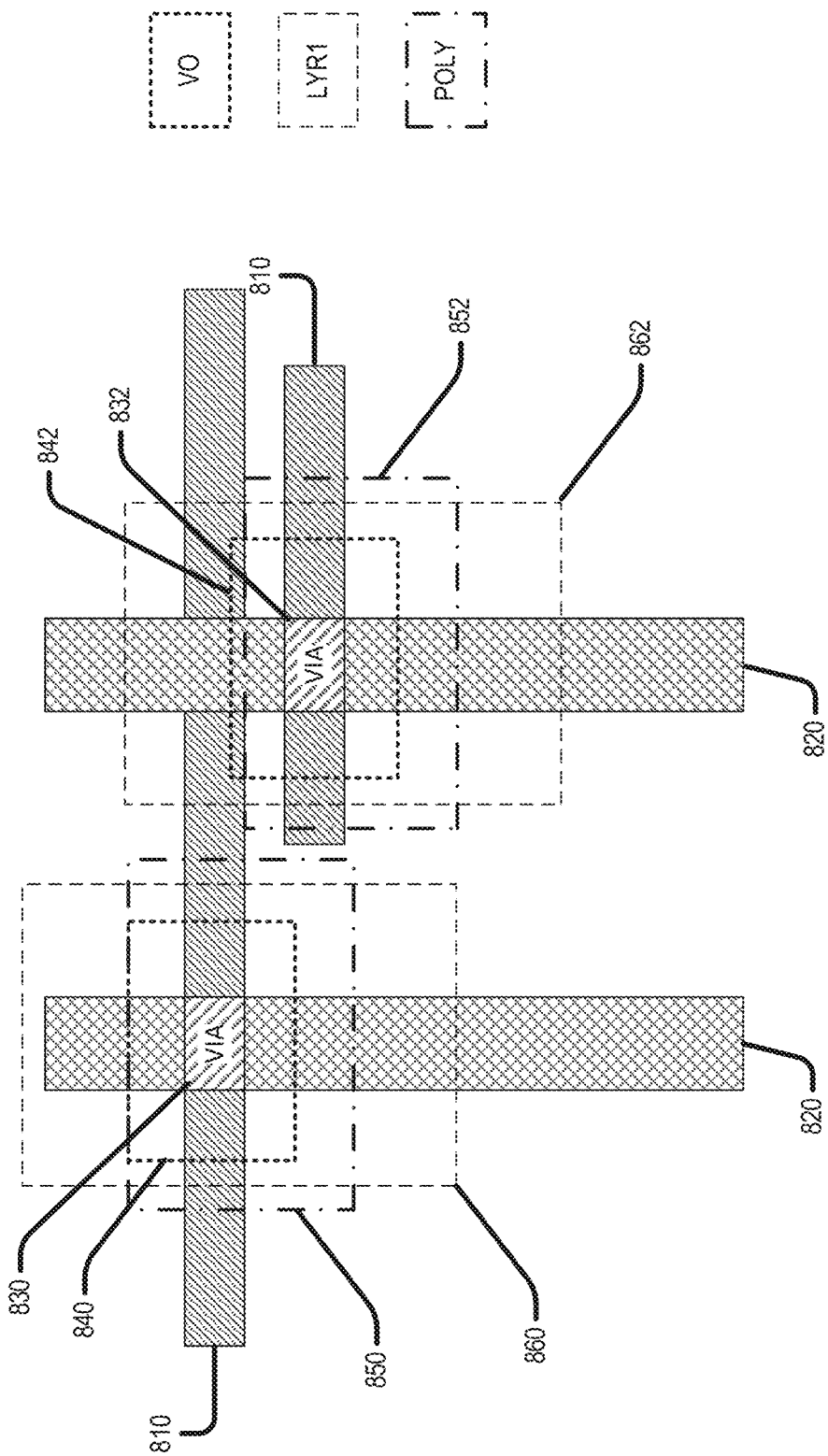

FIG. 8 illustrates footprints or halos with respect to a V0 layer on which vias 830, 832 are placed by way of a programmable pattern (of layout shapes) of a layout construct object described herein. Various embodiments determine legal areas of placement for a layout construct by generating the footprint or halo area around layout shapes of the layout construct that are to be connected, thereby making sure that there are no other shapes in the area. FIG. 8 illustrates footprint or halo areas (footprints or halos) of the layout shapes of the layout construct with respect to a LYR1 layer on which layout shapes 810 are disposed, and with respect to a POLY layer on which layout shapes 820 are disposed. The layout shapes 810 and the layout shapes 820 can be associated with two different networks of the circuit design. As shown, the footprints 860, 862 of the layout shapes 810 on the LYR1 layer, the footprints 850, 852 of the layout shapes 820 on the POLY layer, and the footprints 840, 842 of the vias 830, 832 on the V0 layer can overlap, For some embodiments, a new layout shape could not be placed on the footprints. Accordingly, as shown the via 830 can be placed first, and then the via 832 can be placed next without overlapping with any of the footprints 840, 850, 860 of the via 830, the layout shape 810, or the layout shape 820.

Figure 9:
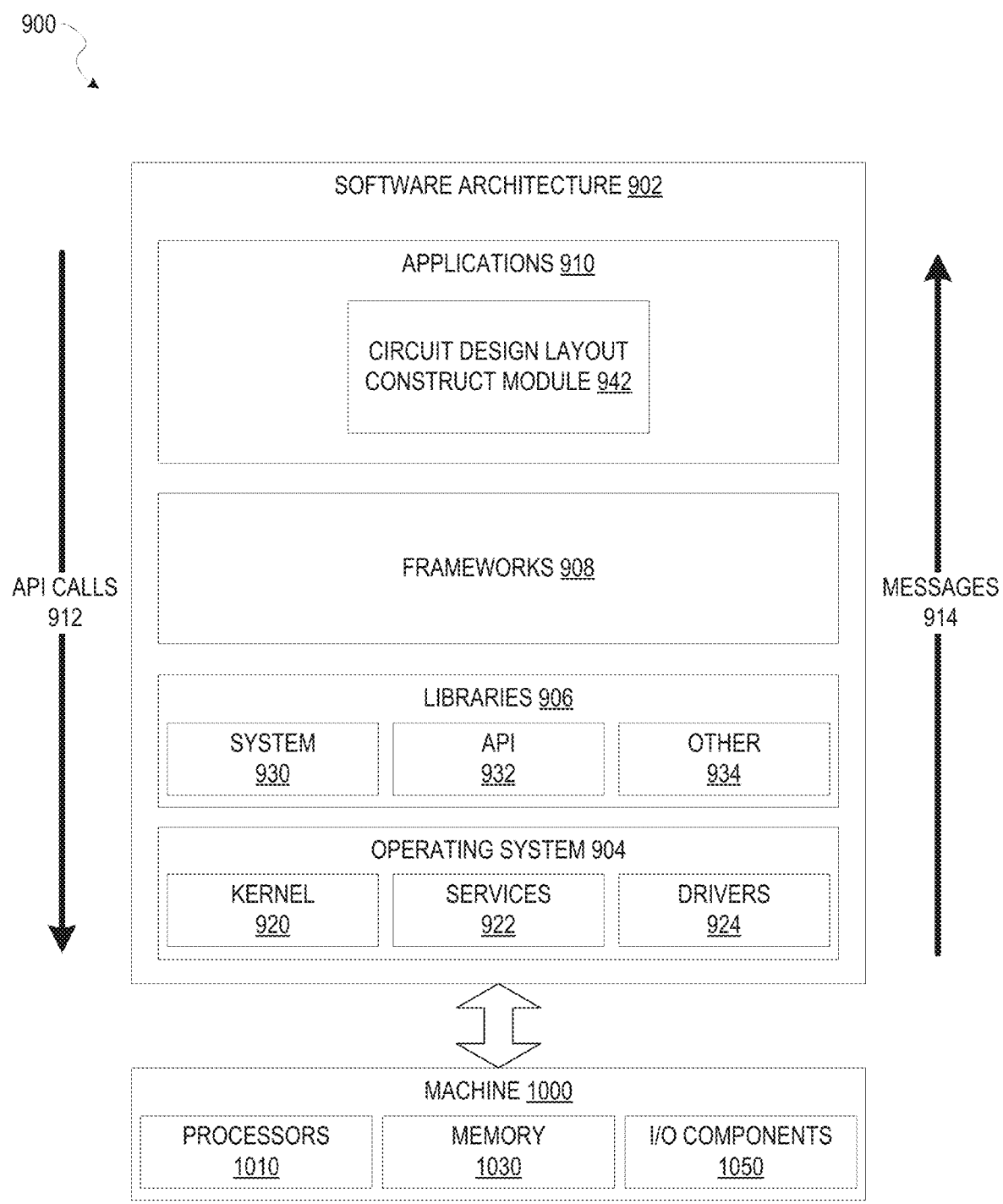
FIG. 9 is a block diagram illustrating an example of a software architecture that may be operating on an EDA computing device and may be used with methods for using a layout construct with respect to a circuit design layout, according to some embodiments.

FIG. 9 is a block diagram 900 illustrating an example of a software architecture 902 that may be operating on an EDA computer and may be used with methods for using a layout construct with respect to a circuit design layout, according to some example embodiments. The software architecture 902 can be used as an EDA computing device to implement any of the methods described above. Aspects of the software architecture 902 may, in various embodiments, be used to store circuit designs, and to generate circuit designs, from which physical devices may be generated.

FIG. 9 is merely a non-limiting example of a software architecture 902, and it will be appreciated that many other architectures can be implemented to facilitate the functionality described herein. In various embodiments, the software architecture 902 is implemented by hardware such as a machine 1000 of FIG. 10 that includes processors 1010, memory 1030, and input/output (I/O) components 1050. In this example, the software architecture 902 can be conceptualized as a stack of layers where each layer may provide a particular functionality. For example, the software architecture 902 includes layers such as an operating system 904, libraries 906, software frameworks 908, and applications 910. Operationally, the applications 910 invoke application programming interface (API) calls 912 through the software stack and receive messages 914 in response to the API calls 912, consistent with some embodiments. In various embodiments, any client device, any server computer of a server system, or any other device described herein may operate using elements of the software architecture 902. An FDA computing device described herein may additionally be implemented using aspects of the software architecture 902, with the software architecture 902 adapted for using a layout construct with respect to a circuit design layout in any manner described herein.

In one embodiment, an EDA application of the applications 910 performs placement and adjustment of a layout construct with respect to a circuit design layout based on context, according to embodiments described herein, using various modules within the software architecture 902. For example, in one embodiment, an EDA computing device similar to the machine 1000 includes the memory 1030 and the one or more processors 1010. The processors 1010 also implement a circuit design layout construct module 942, which can place and adjust a layout construct with respect to a circuit design layout based on context, in accordance with various embodiments described herein.

In various other embodiments, rather than being implemented as modules of the one or more applications 910, the circuit design layout construct module 942 may be implemented using elements of the libraries 906, the operating system 904, or the software frameworks 908.

In various implementations, the operating system 904 manages hardware resources and provides common services. The operating system 904 includes, for example, a kernel 920, services 922, and drivers 924. The kernel 920 acts as an abstraction layer between the hardware and the other software layers, consistent with some embodiments. For example, the kernel 920 provides memory management, processor management (e.g., scheduling), component management, networking, and security settings, among other functionalities. The services 922 can provide other common services for the other software layers. The drivers 924 are responsible for controlling or interfacing with the underlying hardware, according to some embodiments. For instance, the drivers 924 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 906 provide a low-level common infrastructure utilized by the applications 910. The libraries 906 can include system libraries 930 such as libraries of blocks for use in an EDA environment or other libraries that can provide functions such as memory allocation functions, string manipulation functions, mathematic functions, and the like. In addition, the libraries 906 can include API libraries 932 such as media libraries (e.g., libraries to support presentation and manipulation of various media formats such as Joint Photographic Experts Group (JPEG or JPG), or Portable Network Graphics (PNG)), graphics libraries (e.g., an Opener, framework used to render in 2D and 3D in a graphic context on a display), database libraries (e.g., SQLite to provide various relational database functions), web libraries (e.g., WebKit to provide web browsing functionality), and the like. The libraries 906 may also include other libraries 934.

The software frameworks 908 provide a high-level common infrastructure that can be utilized by the applications 910, according to some embodiments. For example, the software frameworks 908 provide various graphic user interface (GUI) functions, high-level resource management, high-level location services, and so forth. The software frameworks 908 can provide a broad spectrum of other APIs that can be utilized by the applications 910, some of which may be specific to a particular operating system 904 or platform. In various embodiments, the systems, methods, devices, and instructions described herein may use various tiles, macros, libraries, and other elements of an EDA design environment to implement a layout construct with respect to a circuit design layout as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 902, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof, For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and. permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (:e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or amongst two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. The methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines 1000 including processors 1010), with these operations being accessible via a network (e.g., the Internet) and via one or more appropriate interfaces (e.g., an API). In certain embodiments, for example, a client device may relay or operate in communication with cloud computing systems and may access circuit design information in a cloud environment. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations. As used herein, "processor-implemented module" refers to a hardware module implemented using one or more processors.

The performance of certain of the operations may be distributed among the processors, not only residing within a single machine 1000, but deployed across a number of machines 1000. In some example embodiments, the processors 1010 or processor-implemented modules are located in a single geographic location (e.g., within a home environment, an office environment, or a server farm). In other example embodiments, the processors or processor-implemented modules are distributed across a number of geographic locations.

Figure 10:
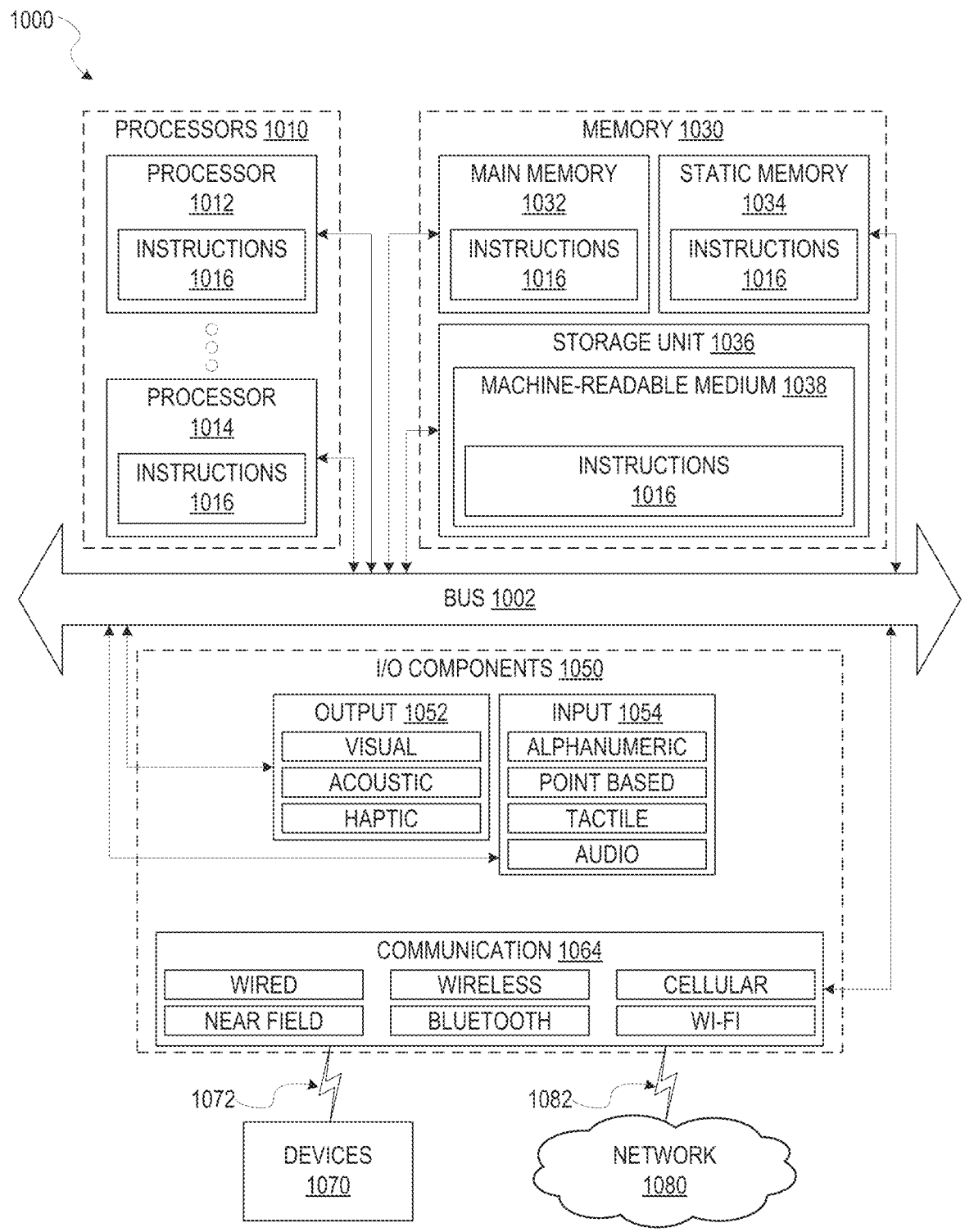
FIG. 10 is a diagram representing a machine in the form of a computer system within which a set of instructions are executed, causing the machine to perform any one or more of the methods discussed herein, according to some embodiments.

FIG. 10 is a diagrammatic representation of the machine 1000 in the form of a computer system within which a set of instructions may be executed for causing the machine 1000 to perform any one or more of the methodologies discussed herein, according to an example embodiment. FIG. 10 shows components of the machine 1000, which is, according to sonic embodiments, able to read instructions from a machine-readable medium (e.g., a machine-readable storage medium) and perform any one or more of the methodologies discussed herein. Specifically, FIG. 10 shows a diagrammatic representation of the machine 1000 in the example form of a computer system, within which instructions 1016 (e.g., software, a program, an application, an applet, an app, or other executable code) for causing the machine 1000 to perform any one or more of the methodologies discussed herein can be executed. In alternative embodiments, the machine 1000 operates as a standalone device or can be coupled (e.g., networked) to other machines. In a networked deployment, the machine 1000 may operate in the capacity of a server machine or a client machine in a server-client network environment, or as a peer machine in a peer-to-peer (or distributed) network environment. The machine 1000 can comprise, but not be limited to, a server computer, a client computer, a personal computer (PC), a tablet computer, a laptop computer, a netbook, or any machine capable of executing the instructions 1016, sequentially or otherwise, that specify actions to be taken by the machine 1000. Further, while only a single machine 1000 is illustrated, the term "machine" shall also be taken to include a collection of machines 1000 that individually or jointly execute the instructions 1016 to perform any one or more of the methodologies discussed herein.

In various embodiments, the machine 1000 comprises processors 1010, memory 1030, and I/O components 1050, which can be configured to communicate with each other via a bus 1002. In an example embodiment, the processors 1010 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 1012 and a processor 1014 that may execute the instructions 1016. The term "processor" is intended to include multi-core processors 1010 that may comprise two or more independent processors 1012, 1014 (also referred to as "cores") that can execute the instructions 1016 contemporaneously. Although FIG. 10 shows multiple processors 1010, the machine 1000 may include a single processor 1012 with a single core, a single processor 1012 with multiple cores (e.g., a multi-core processor 1012), multiple processors 1010 with a single core, multiple processors 1010 with multiple cores, or any combination thereof.

The memory 1030 comprises a main memory 1032, a static memory 1034, and a storage unit 1036 accessible to the processors 1010 via the bus 1002, according to some embodiments. The storage unit 1036 can include a machine-readable medium 1038 on which are stored the instructions 1016 embodying any one or more of the methodologies or functions described herein. The instructions 1016 can also reside, completely or at least partially, within the main memory 1032, within the static memory 1034, within at least one of the processors 1010 (e.g., within the processor's cache memory), or any suitable combination thereof, during execution thereof by the machine 1000. Accordingly, in various embodiments, the main memory 1032, the static memory 1034, and the processors 1010 are considered machine-readable media 1038.

As used herein, the term "memory" refers to a machine-readable medium 1038 able to store data temporarily or permanently and may be taken to include, but not be limited to, random-access memory (RAM), read-only memory (ROM), buffer memory, flash memory, and cache memory. While the machine-readable medium 1038 is shown, in an example embodiment, to be a single medium, the term "machine-readable medium" should be taken to include a single medium or multiple media (e.g., a centralized or distributed database, or associated caches and servers) able to store the instructions 1016. The term "machine-readable medium" shall also be taken to include any medium, or combination of multiple media, that is capable of storing instructions (e.g., the instructions 1016) for execution by a machine (e.g., the machine 1000), such that the instructions, when executed by one or more processors of the machine (e.g., the processors 1010), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The 110 components 1050 include a wide variety of components to receive input, provide output, produce output, transmit information, exchange information, capture measurements, and so on. In general, it will be appreciated that the I/O components 1050 can include many other components that are not shown in FIG. 10. The I/O components 1050 are grouped according to functionality merely for simplifying the following discussion, and the grouping is in no way limiting. In various example embodiments, the I/O components 1050 include output components 1052 and input components 1054. The output components 1052 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1054 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1050 may include communication components 1064 operable to couple the machine 1000 to a network 1080 or devices 1070 via a coupling 1082 and a coupling 1072, respectively. For example, the communication components 1064 include a network interface component or another suitable device to interface with the network 1080. In further examples, the communication components 1064 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1070 may be another machine or any of a wide variety of peripheral devices (e.g., a peripheral device coupled via a USB).

In various example embodiments, one or more portions of the network 1080 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1080 or a portion of the network 1080 may include a wireless or cellular network, and the coupling 1082 may be a Code Division Multiple Access (CDMA) connection, a Global System for Mobile communications (GSM) connection, or another type of cellular or wireless coupling.

Furthermore, the machine-readable medium 1038 is non-transitory (in other words, not having any transitory signals) in that it does not embody a propagating signal. However, labeling the machine-readable medium 1038 "non-transitory" should not be construed to mean that the machine-readable medium 1038 is incapable of movement; the machine-readable medium 1038 should be considered as being transportable from one physical location to another. Additionally, since the machine-readable medium 1038 is tangible, the machine-readable medium 1038 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned. and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A non-transitory computer-readable medium comprising instructions that, when executed by a hardware processor of a device, cause the device to perform Operations comprising:
   accessing circuit design data describing a circuit design layout;
   detecting a specified pattern of existing layout shapes in the circuit design layout, the specified pattern of existing layout shapes being suitable for insertion of at least one programable pattern of layout shape;

identifying a layout construct placement location in the circuit design layout based on the specified pattern of existing layout shapes detected in the circuit design layout;

causing a client device to display a visual representation of a layout construct placeholder at a location over a visual representation of the circuit design layout, the location corresponding to the layout construct placement location;

after causing the visual representation of the layout construct placeholder to display, identifying, from a set of layout construct objects, a layout construct object for the layout construct placement location based on context information associated with the layout construct placement location and based on a programmable pattern of layout shapes defined by the layout construct object, the programmable pattern of layout shapes comprising an adjustable layout shape having at least one of an adjustable dimension or an adjustable position within the programmable pattern; and placing, at the layout construct placement location, an instance of the programmable pattern of layout shapes from the layout construct object.

2. The non-transitory computer-readable medium of claim 1, wherein the placing of the instance comprises adjusting, based on the context information, the adjustable layout shape in the instance of the programmable pattern of layout shapes.

3. The non-transitory computer-readable medium of claim 1, wherein the placing of the instance comprises adjusting, based on the context information, a topology of the programmable pattern of layout shapes.

4. The non-transitory computer-readable medium of claim 1, wherein the adjustable dimension or the adjustable position is determined by a value of a variable of the layout construct object, and the adjusting of the adjustable layout shape in the instance comprises:
setting the value based on the context information.

5. The non-transitory computer-readable medium of claim 1, wherein the adjustable position is determined by a value of the layout construct object, and the adjusting of the adjustable layout shape in the instance comprises:
setting the value based on the context information.

6. The non-transitory computer-readable medium of claim 1, wherein the context information comprises physical context information regarding one or more existing layout shapes of the circuit design layout associated with the layout construct placement location.

7. The non-transitory computer-readable medium of claim 1, wherein the context information comprises electrical context information describing at least one of a net type, net name, or a net classification of one or more existing layout shapes of the circuit design layout associated with the layout construct placement location.

8. The non-transitory computer-readable medium of claim 1, wherein the context information comprises context information regarding one or more existing layout shapes of the circuit design layout to which one or more layout shapes of the programmable pattern are to connect.

9. The non-transitory computer-readable medium of claim 1, wherein the layout construct object is generated based on at least one of:
a combination of a set of design rule constraints and a circuit design topology;
a circuit architecture selection; or
a design rule constraint variation.

10. The non-transitory computer-readable medium of claim 1, wherein the placing of the instance comprises placing the instance at the layout construct placement location while respecting a set of technology ground rules.

11. The non-transitory computer-readable medium of claim 10, wherein the placing of the instance comprises adjusting, based on the context information, the adjustable layout shape in the instance of the programmable pattern of layout shapes such that the adjustable layout shape does not violate any rules in the set of technology ground rules.

12. The non-transitory computer-readable medium of claim 1, wherein the identifying of the layout construct object for the layout construct placement location based on the context information associated and the programmable pattern of layout shapes defined by the layout construct object comprises:
identifying the layout construct object for the layout construct placement location based on relation of one or more layout shapes at or around the layout construct placement location that the programmable pattern of layout shapes is intending to connect to.

13. The non-transitory computer-readable medium of claim 1, wherein the operations comprise:
propagating connectivity information, of the circuit design layout, with respect to the instance of the programmable pattern of layout shapes.

14. The non-transitory computer-readable medium of claim 1, wherein the operations comprise:
after the placing of the instance, causing a visual representation of one or more footprints of the instance to be displayed at the location over the visual representation of the circuit design layout, the one or more footprints being determined based on adjustability of one or more layout shapes in the programmable pattern of layout shapes.

15. The non-transitory computer-readable medium of claim 1, wherein the operations comprise:
prior to the placing of the instance:
causing a prompt to be displayed at a client device, the prompt asking a user whether to place the instance at the layout construct placement location; and
receiving a user input in response to the prompt, the placing of the instance at the layout construct placement location based on the user input.

16. The non-transitory computer-readable medium of claim 1, wherein the layout construct placement location is a location where a connection between two or more layers is to be generated.

17. The non-transitory computer-readable medium of claim 16, wherein the programmable pattern of layout shapes implements a via that connects the two or more layers at the location.

18. A method comprising:
detecting, by a hardware processor, a specified pattern of existing layout shapes in a circuit design layout, the specified pattern of existing layout shapes being suitable for insertion of at least one programable pattern of layout shape:, identifying, by the hardware processor, a layout construct placement location in the circuit design layout based on the specified pattern of existing layout shapes detected in the circuit design layout;
causing, by the hardware processor, a client device to display a visual representation of a layout construct placeholder at a location over a visual representation of the circuit design layout, the location corresponding to the la Tout construct placement location;

after causing the visual representation of the layout construct placeholder to display, identifying, by the hardware processor and from a set of layout construct objects, a layout construct object for the layout construct placement location based on context information associated with the layout construct placement location and based on a programmable pattern of layout shapes defined by the layout construct object, the programmable pattern of layout shapes comprising an adjustable layout shape having at least one of an adjustable dimension or an adjustable position within the programmable pattern; and placing, by the hardware processor and at the layout construct placement location, an instance of the programmable pattern of layout shapes from the layout construct object.

19. A device comprising:

a memory storing instructions: and a hardware processor communicatively coupled to the memory and configured by the instructions to perform operations comprising:

detecting a specified pattern of existing layout shapes in a circuit design layout, the specified pattern of existing layout shapes being suitable for insertion of at least one programable pattern of layout shape;

identifying a layout construct placement location in the circuit design layout based on the specified pattern of existing layout shapes detected in the circuit design layout;

causing a client device to display a visual representation of a layout construct placeholder at a location over a visual representation of the circuit design layout, the location corresponding to the layout construct placement location:

after causing the visual representation of the layout construct placeholder to display, identifying, from a set of layout construct objects, a layout construct object for the layout construct placement location based on context information associated with the layout construct placement location and based on a programmable pattern of layout shapes defined by the layout construct object, the programmable pattern of layout shapes comprising an adjustable layout shape having at least one of an adjustable dimension or an adjustable position within the programmable pattern; and placing, at the layout construct placement location, an instance of the programmable pattern of layout shapes from the layout construct object.

20. The device of claim 19, wherein the placing of the instance comprises adjusting, based on the context information, the adjustable layout shape in the instance of the programmable pattern of layout shapes.

\* \* \* \* \*